United States Patent [19]

Kroger

[11] 3,786,316

[45] Jan. 15, 1974

[54] HIGH FREQUENCY DIODE ENERGY TRANSDUCER AND METHOD OF MANUFACTURE

[75] Inventor: Harry Kroger, Sudbury, Mass.

[73] Assignee: Sperry Rand Corporation, New York, N.Y.

[22] Filed: June 2, 1972

[21] Appl. No.: 259,091

Related U.S. Application Data

[62] Division of Ser. No. 37,638, May 15, 1970, Pat. No. 3,684,901.

[52] U.S. Cl. ..... 317/234 R, 317/234 W, 317/235 Z

[51] Int. Cl. .............................................. H01l 5/00

[58] Field of Search..............317/235, 40.13, 234, 11

[56] References Cited

UNITED STATES PATENTS 3,593,068 7/1971 Rosier ................................ 317/234

*Primary Examiner*—John W. Huckert
*Assistant Examiner*—E. Wojciechowicz
*Attorney*— S. C. Yeaton and Howard P. Terry

[57] ABSTRACT

A miniature microwave or high frequency amplifier or oscillator diode array is disclosed in the form of a semiconductor microcircuit array of surface diodes with interconnections arranged for efficient distribution of bias and oscillating high frequency fields to the active diode elements for provoking high efficiency exchange of energy therein between the oscillating microwave or high frequency field and an electrical power sou.ce.

4 Claims, 10 Drawing Figures

HIGH FREQUENCY DIODE ENERGY TRANSDUCER AND METHOD OF MANUFACTURE

CROSS REFERENCE TO RELATED APPLICATION

This is a division of patent application Ser. No. 37,638, now U.S. Pat. No. 3684901 filed May 15, 1970 and entitled: 'High Frequency Diode Energy Transducer and Method of Manufacture' in the name of Harry Kroger.

BACKGROUND OF THE INVENTION

1. Field of the Invention

The invention relates to the art of efficient generation of microwave or high frequency signals in hollow or other transmission line devices. More particularly, the invention pertains to semiconductor microcircuit diode array means for the efficient amplification of microwave or high frequency signals and to the method of manufacture of such surface diode arrays as planar or other regular microcircuits capable of efficient operation at elevated power levels.

2. Description of the Prior Art

High frequency oscillations are readily attained in oscillator and amplifier systems combining cavity resonators or other resonators or high frequency transmission line devices with active semiconductor diodes exhibiting useful negative resistance properties when placed in suitable electrical bias fields under pulsed, as well as under continuous wave operation. The prior art has provided means for effective coupling of such energy with bias fields in individual semiconductor diodes operating according to various different and unusual modes, including semiconductor diodes which demonstrate, for instance, the avalanche transit time phenomena or the high efficiency mode phenomena.

Lacking in the prior art are means for solving problems which inherently limit the utility of conventionally packaged diodes as high frequency energy transducers. An increasing need is present for semiconductor diode apparatus capable of more fully meeting the capabilities promised by new high efficiency oscillator and amplifier circuits. Improved operation at high power levels is particularly demanded, but attempts to use series connected diodes of essentially standard form have met with only mixed success, even when the diodes have been individually selected with care. The prior art is not known to offer efficient semiconductor diode arrays of the surface diode type embodied in planar or other microcircuit configurations featuring uniform biasing, uniform high frequency field interaction, and uniform temperature control elements. Thermal time constants have also not been adequately controlled in the instance of high power operation.

SUMMARY OF THE INVENTION

The present invention pertains both to a novel surface semiconductor diode for efficient interaction with microwave or high frequency energy and to its method of manufacture. Such surface diodes may, for example, be arranged according to one aspect of the invention, in regular or ordered arrays on the surface of a microcircuit wafer. The diodes in the array and certain circuit interconnections are arranged in a configuration compatible with the requirements of efficient high frequency energy coupling and generation and simultaneously meeting with restrictions imposed by the need to supply suitable bias voltages across each surface diode element. Further, according to the invention, low impedance heat flow paths efficiently coupling the surface diode junctions to heat sinks external of the oscillator circuit are supplied for permitting high power operation. According to the method of manufacture of the novel surface diode array, there may be included steps of masking, etching, dopant diffusing, and dopant drive-in diffusing to form semiconductor elements of the array, electrical conductor deposition and special depositions of a thermally conducting but electrical insulating material for providing heat flow paths, and for final protective passivation of the product.

DESCRIPTION OF THE PREFERRED EMBODIMENT

FIGS. 1 to 8 are used to explain the novel constructional steps required for producing the integrated planar high-efficiency avalanche diode array of the present invention, to illustrate the novel structure of the semiconductor diode array itself, and furthermore to present novel intermediate semiconductor device products generated according to the method. The nature of several of the novel structural aspects of the invention will be made apparent as details of its manner of manufacture are presented.

It will be understood that the useful area to be occupied by the diode array is dictated in part by the choice of the microwave circuit in which the array is to be used. For example, the size and configuration of an array to be used within a low-loss ridged wave guide transmission line may be generally determined by the area of the gap above the ridge itself where the microwave electric field is concentrated and has a suitably regular pattern. For example, the array for a $K_a$-band ridged guide might be placed on a substrate 0.62 by 0.32 centimeters in size.

The size and configuration of an array for use in shunt in a coaxial transmission line may take on a size dictated by the relative diameters of the coaxial line conductors and a configuration compatible with the electric field distribution normally found in coaxial line. An array may be fabricated in a cylindrical shell or rod of semiconductor material for insertion in series with the central conductor of a coaxial line. Thus, the array may occupy only a portion of the cross sectional area of a hollow transmission line, or may be regularly distributed throughout said cross sectional area. Diode arrays, according to the present invention, are made by series or parallel or parallel-series connection of novel surface diodes between transmission line conductors.

Figure 1:
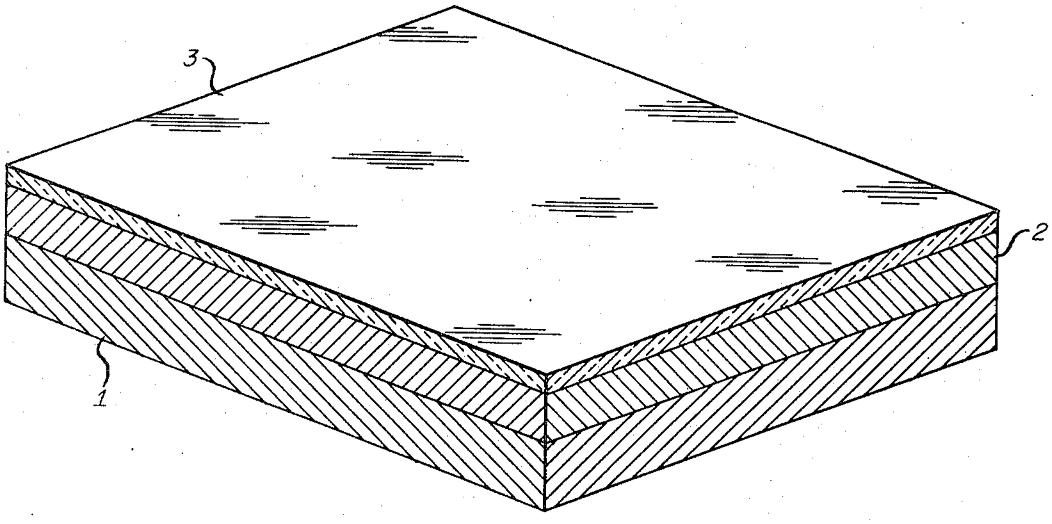
FIGS. 1 to 8 are isometric views, partly in cross section and on a greatly enlarged scale, showing the intermediate and final structures produced in practicing the successive steps of the invention. Relative dimensions are also exaggerated for convenience in the drawings since some dimensions are very small.

Referring now to FIG. 1, the basic starting material for the array may be a planar substrate layer 1 of a lightly doped type n material such as silicon (substantially intrinsic but with a slight prepondernace of donors). Substrate layer 1 has epitaxially grown on it a layer 2 of type n material such as silicon doped at a level between $5 \times 10^{15}$ and $2 \times 10^{16}$. The doping level and thickness of epitaxial layer 2 are preferably those which permit punch-through operation without the intervention of undesired types of diode operations. For example, layer 1 may be 50 to 100 microns thick, and layer 2 5 microns thick. The dopant materials for layers 1 and 2 may be arsenic or antimony. Antimony is the preferred dopants for layers 1 and 2, because antimony diffuses slowly and will accordingly be relatively undisturbed by subsequently to be performed diffusions of phosphorous and boron. Thus, the conductivity profile between layers 1 and 2 remains relatively fixed. Fabrication of layers 1 and 2 as above described may be achieved in any of several conventional ways, and therefore need not be dealt with in detail herein.

Deposition of a silicon dioxide layer 3 substantially 0.5 microns thick on type n layer 2 of the wafer is next accomplished for its later use as an apertured mask for drive-in diffusion of dopant materials. Before deposition of layer 3, the surface of layer 2 may be suitably prepared by cleaning, for example, by successive room temperature washes of trichloro-ethylene, methyl alcohol, and hydrofluoric acid, and then by rinsing in agitated hot de-ionized water, finally being dried in a warm flow of clean, dry nitrogen.

The clean wafer is at once placed in a confined chamber provided with a flow of clean, dry oxygen and nitrogen gases to which a flow of $SiH_4$, or silane gas, is then added for substantially 5 minutes for provoking the formation of a silicon dioxide layer 3 of the desired thickness. Flow of reactive silane is then stopped and the chamber is flushed free of silane by continuing the flow of oxygen and nitrogen for an additional period. Layer 3 may alternatively be grown on the silicon in a heated oxygen or steam environment.

The wafer, which now has the structure shown in FIG. 1, is at once removed from the silane reaction chamber and a photoresist material is applied in the conventional manner on top of silicon dioxide overlayer 3. A mask (not shown) having a plurality of parallel equally spaced-apart elongated slots is placed in parallel relation over the silicon dioxide surface 3 and the photoresist layer is exposed to actinic radiation in the well known manner. After exposure, the photoresist material is developed and undeveloped areas of the photoresist material are removed in the conventional manner.

The wafer is now submerged in an agitated etchant solution suitable for dissolving parts of silicon dioxide layer 3 exposed through the elongated openings in the temporary photoresist layer. The etchant may comprise, for example, a solution having one part of hydrofluoric acid and nine parts of ammonium fluoride. The wafer is then rinsed in de-ionized water and is dried. The remaining photoresist may now be removed by a stripper such as by a solution of one part of sulfuric acid with nine parts of nitric acid used at a temperature near 100° Centigrade for about ten minutes.

Figure 2:
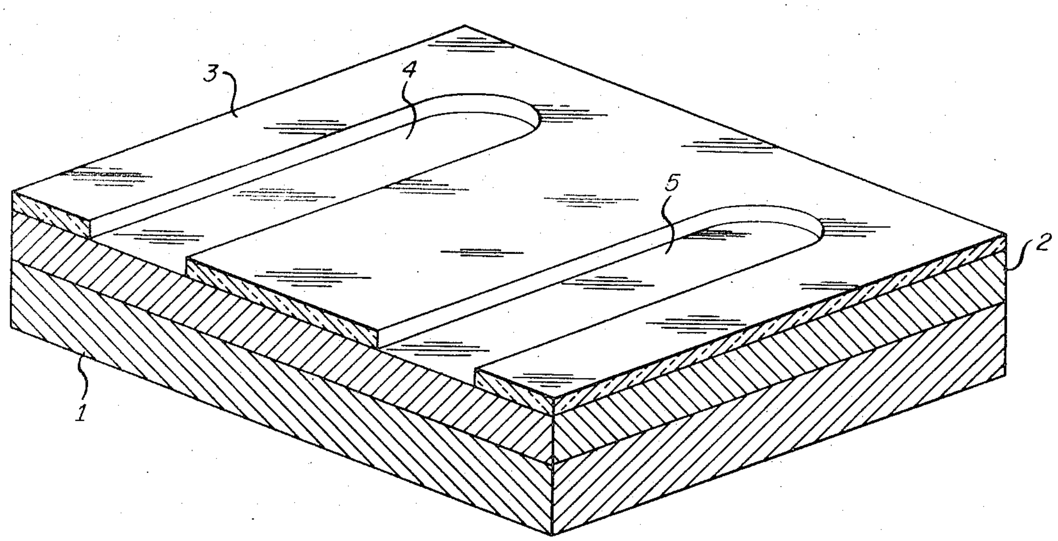
Figure 3:
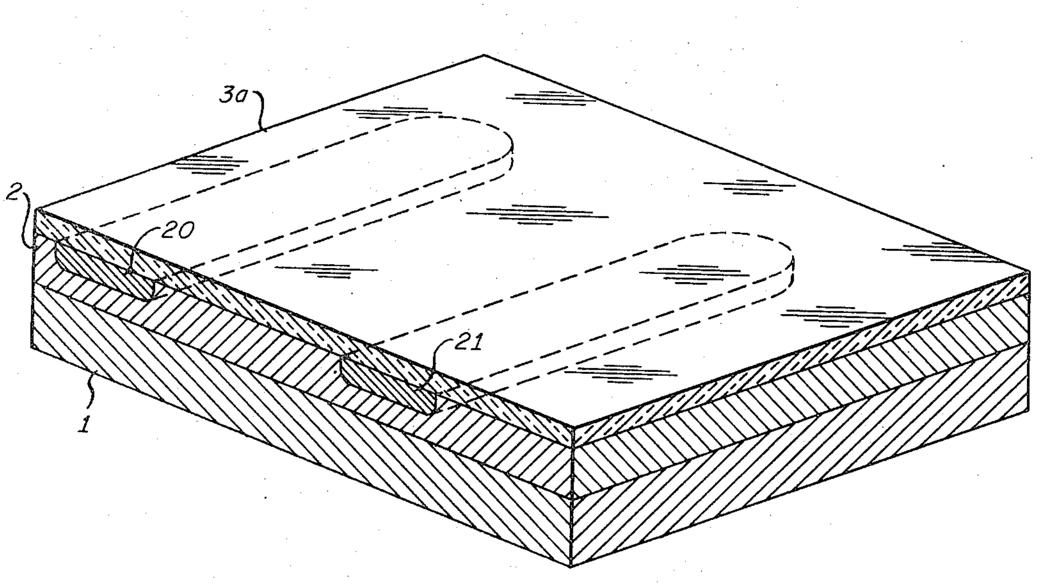

The device in this state has the appearance illustrated in FIG. 2, the silicon dioxide layer 3 having been provided with regularly spaced windows, such as elongated apertures or windows 4 and 5. In the example of the array substrate cited above having width and length dimensions of 0.32 and 0.62 centimeters, respectively, each such aperture is about 25 microns wide and 0.1 centimeters long. The separation between apertures 4 and 5 is, for example, 100 microns.

Figure 9:
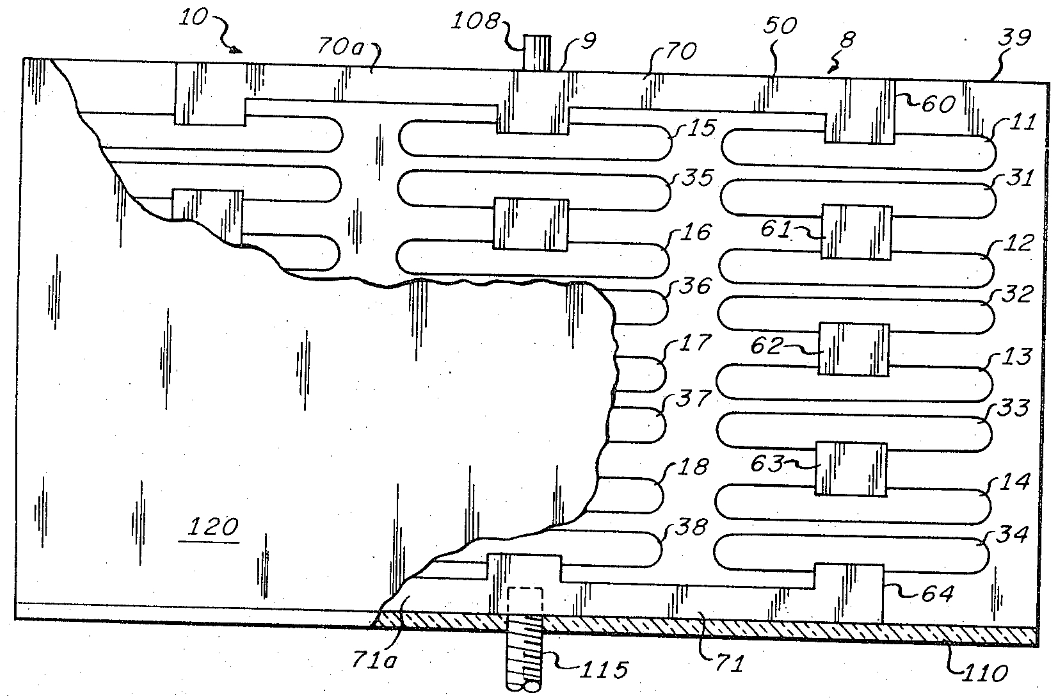
FIG. 9 is an elevation view, partly in cross section, of a form of the invention.

As will be seen (FIG. 9), a vertical array of apertures or windows like windows 4 and 5 results from the fabrication step, such as is required to produce one side or electrode of each of the series of diodes in sub-array 8 of FIG. 9 (electrodes 11, 12, 13, and 14, for example). At the same time, the mask may be equipped to produce a second sub-array of windows for making one side or electrode of each of the series of diodes in a parallel sub-array 9 of series diodes, sub-array 9 being appropriately spaced from sub-array 8. Corresponding parts of the similar third diode sub-array 10 may be similarly formed in the same operation.

The objective of the windows or apertures such as apertures 4 and 5 in silica layer 3 is to permit diffusion of a type p dopant such as boron into layer 2 to form thin elongated layers such as layers 20 and 21 (FIG. 3) of type $p^+$ semiconductor material substantially directly beneath such apertures. Layers 20, 21 are to be about 0.1 microns thick. Since boron is not readily vaporized, a thin layer of the material or of its oxide may be deposited on the exposed semiconductor layer 2 by sputtering or evaporation in a vacuum or by simple mechanical or chemical deposition. On the other hand, boron may actually be diffused in its gas phase if the wafer is exposed to it in a furnace reactor at about 1,100° Centigrade for on the order of 10 minutes; while subjecting the device to a flow of dry oxygen, the boron is driven into layer 2.

When diffusion layers such as 20 and 21 are fully formed, a smooth layer 3*a* of silica (FIG. 3) is regrown on the surface of layer 2. To insure uniformity of the product, the silica layer 3 used in boron deposition may be removed withh the hydrofluoric acid-ammonium fluoride etchant described previously. The wafer is then cleaned and the new layer 3*a* of silica is deposited using the previously described silane process. Layer 3*a* may have about the same thickness as layer 3.

The previously used mask having a plurality of parallel equally spaced-apart elongated slots is placed in parallel relation over the silicon dioxide surface 3*a*, photoresist material having been applied to surface 3*a* immediately after the silane process. The mask is placed in a new position, being moved substantially perpendicular to the major dimension of window 4 of FIG. 2 by substantially the width of window 4 plus a dimension which is to be the width of the to-be-generated diode junction, say 1.5 microns. The photoresist layer is exposed to actinic radiation and the material is developed in the conventional manner, after which undeveloped material is removed.

The wafer is again submerged in an agitated etchant solution for dissolving the part of the silicon dioxide layer 3*a* exposed through the elongated openings in the photoresist layer. The wafer is cleaned and the remaining developed photoresist material is removed by immersion in a stripper solution.

Figure 4:
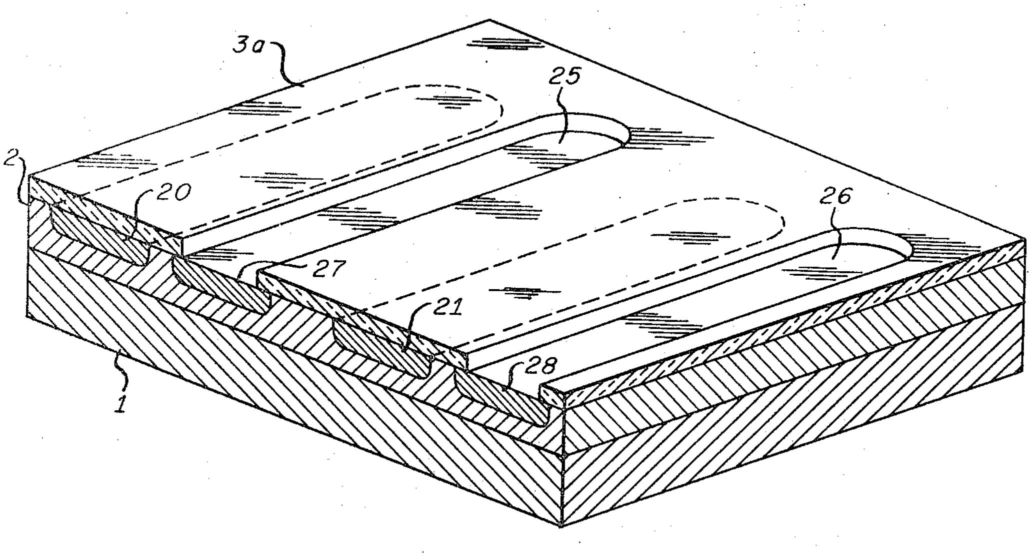

The silica layer 3*a* has, at this stage, the appearance shown in FIG. 4, the layer 3*a* having been supplied with a new set of regularly spaced windows, such as elongated apertures or windows 25 and 26 whose length and width dimensions substantially duplicate those of windows 4 and 5 of silica layer 3 in FIG. 2. As will be seen (FIG. 9), a vertical sub-array of windows like windows 25 and 26 results from the fabrication step, such as required to produce a second side or electrode of each of the series of diodes in sub-array 8 of FIG. 9 (electrodes 31, 32, 33, and 34, for example). A sub-array of second windows may be generated at the same time for making one side or electrodes 35, 36, 37, and 38 of each of the series of surface diodes in the parallel sub-array 9 of series diodes. Corresponding parts of the similar third diode sub-array 10 may be formed simultaneously.

The objective of the apertures such as apertures 25 and 26 in silica layer *3a* is to permit diffusion of a type n dopant such as phosphorous into layer 2 to form a second array of thin elongated layers, such as layers 27 and 28 in FIG. 4 of type $n^+$ semiconductor material substantially directly beneath such apertures. Layers 27 and 28 have substantially the same thickness as layers 20 and 21.

Phosphorous doping is accomplished readily from the vapor phase in a manner similar to that required for boron. Phosphorous is diffused through windows 25 and 26 into layer 2 in a reaction chamber from the gas phase, for example, of phosphorous pentoxide, at at temperature of 1,050° Centigrade for a period of 15 minutes. When removed from the phosphorous diffusion reactor, it is seen as in FIG. 4 that each elongated type $p^+$ layer, such as layers 20 and 21, has associated intimately with it a type $n^+$ layer, such as phosphorous doped layers 27 and 28, and that the associated layers, such as layers 20 and 27, have substantially the same thickness. It is to be understood, of course, that the drawings previously discussed and yet to be discussed are grossly exaggerated as to dimensions as a matter of convenience in illustrating and explaining the invention. For example, the separation between the doped layers or electrodes 20 and 27 is to be on the order of 1.5 microns.

Figure 5:
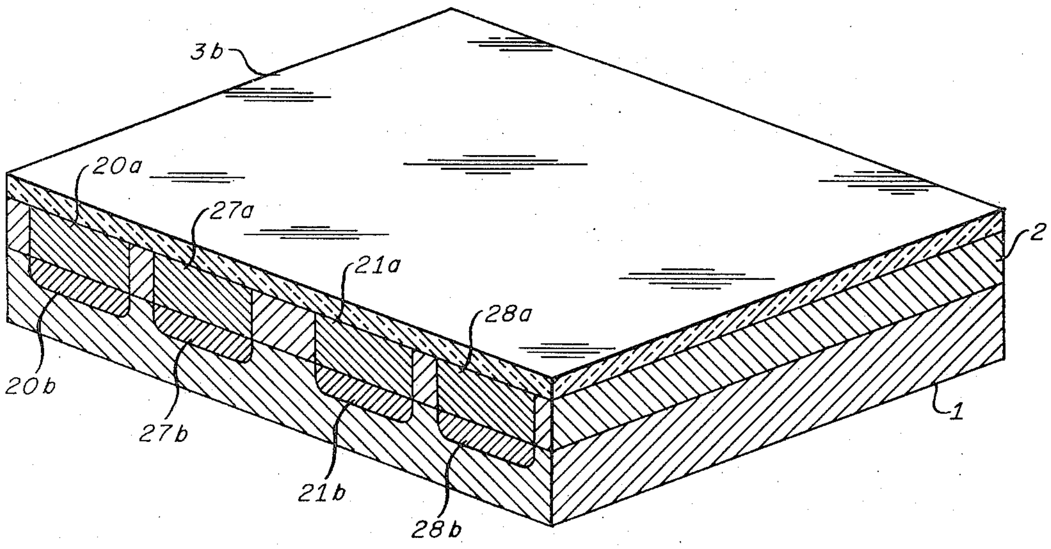

Phosphorous and boron are selected as the dopants for forming the respective type $n^+$ and type $p^+$ layers of substantially equal thickness because these materials have substantially equal diffusion rates in the silicon material employed in the array wafer. Referring now to FIG. 5, a substantially conventional drive-in diffusion process is employed beneficially by virtue of the similar diffusion rates of boron and phosphorous to diffuse the respective layers 20, 27, 21, and 28 further into layer 2 and out into the substrate layer 1 of the wafer.

The drive-in diffusion operation is aided by the presence of a new silica layer *3b*, which prevents loss by out-diffusion of the boron and phosphorous materials. Diffusion is continued past the point where the type $n^+$ and $p^+$ diffusion profiles cross into substrate 1 to form the respective regions *20b*, *27b*, *21b*, and *28b*. The drive-in diffusion process is performed within a furnace at a temperature on the order of 1,050° Centigrade for 200 minutes in an atmosphere of dry nitrogen. The extent of drive-in diffusion may be monitored by using a capacitance bridge during or after the process to measure the separation for example, between the $p^+$ and $n^+$ regions.

It is to be observed that the curvature, for instance, at the lower part of layer *27b* will not prevent avalanche break down on the vertical side of layer *27a*. This obtains because the substrate 1 is only lightly doped. Breakdown voltages may be in excess, for instance, of 100 volts in the intrinsic layer 1, while the breakdown voltage in layer 2 (the active region) may be about 30 volts. Further, the excess portions, such as the layer *21b* extending into substrate layer 1, do not contribute in a substandial way to the capacitance of the diode devices because of the lightly doped character of substrate 1.

Figure 6:
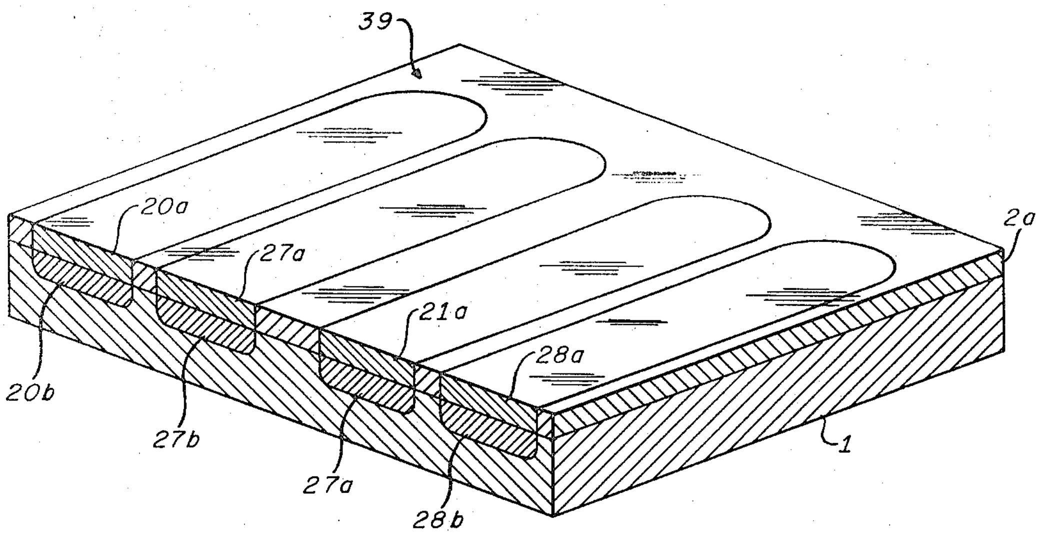

The structure of FIG. 5 is subjected after drive-in diffusion to two steps which generate the structure of FIG. 6. First, the oxide layer *3b* of FIG. 5 is removed, as by the previously described silica etching process. Also, a small surface layer of the epitaxial silicon layer 2 is removed; this removal step is undertaken to remove any curvature or projection for example, of the diffused layer *20a* near the top surface layer 2 due to dopant or impurity segregation into the original oxide layer 1. Such anamolies might cause shorting or other improper operation of an elemental diode. The removal of a top layer from the surface of layer 2 (less than 0.25 microns) is readily accomplished by conventional etching or mechanical procedures. Alternatively, repeated oxidation of the surface of silicon layer 2 may be used, followed by repeated chemical removal of the consequently formed oxide layers. For the purpose of preventing growth of such anamolies, $Si_3N_4$ rather than $SiO_2$ may be used to provide the diffusion masks, since $Si_3N_4$ is more effective in rejecting dopants or impurities. In any event, the desired product is that of FIG. 6, where the modified epitaxial layer *2a* is seen to have placed on the wafer a smooth surface 39 as required for completion of the product.

As a further manufacturing step, current conducting paths are to be placed above the smooth surface 39. Prior to that step, however, it is convenient to place on certain parts of the surface 39 a layer 40 of beryllium oxide; beryllium oxide is known to be a material possessing good thermal conductivity while at the same time demonstrating the high electrical resistivity of many electrically insulating oxide materials. The beryllium oxide layer 40 serves to provide flow channels representing low impedance heat flow paths especially from the elongate diode junctions, such as lineal junctions 41 and 42 of FIG. 7 and from the lineal gaps between diodes, such as gap 43, to a connecting portion 44 of the same beryllium oxide material and thence to an edge thereof such as the edge 50 seen in FIG. 9 which may be directly coupled to a conventional heat sink. Layer 40 is arranged to cover all of surface 39 except for areas occupied by diode layers or elements such as elements *20a*, *27a*, *21a*, and *28a*.

In preparation for the sputtering process, a mask in the shape desired for producing layer 40 is generated with solid portions to bar beryllium oxide from surfaces of layers *20a*, *27a*, *21a*, *28a* and the like and the mask is placed in parallel relation over surface 39. The wafer and the mask firmly clamped against it are placed in a reactive sputtering chamber to serve as an anode for deposit of beryllium oxide. A cathode of beryllium metal, generally of the same size as the anode, is placed opposite the anode surface, the electrodes being separated by a gap of about 3 centimeters. Either direct current or radio frequency sputtering from a beryllium source may be used. Radio frequency sputtering in an inert atmosphere from a beryllium oxide source may alternatively be used.

Reactive sputtering may be performed in a nominally one to one argon-oxygen gas mixture with cathode potentials on the order of 3,000 volts and with a total gas pressure about 10 to 30 × $10^{-3}$ Torr, though variation in these parameters is permitted. Deposition rates are of the order of 0.1 microns per minute, so that oxide films of appreciable thickness for heavy heat conduction are readily fabricated. When the beryllium oxide layer 40 is completed, it may be of the order of three microns thick. The wafer is then removed from the sputtering chamber and the mask is removed. The wafer has the general appearance of the structure shown in FIG. 7, but lacks conductors such as the conductors 60, 61, and 62.

Figure 7:
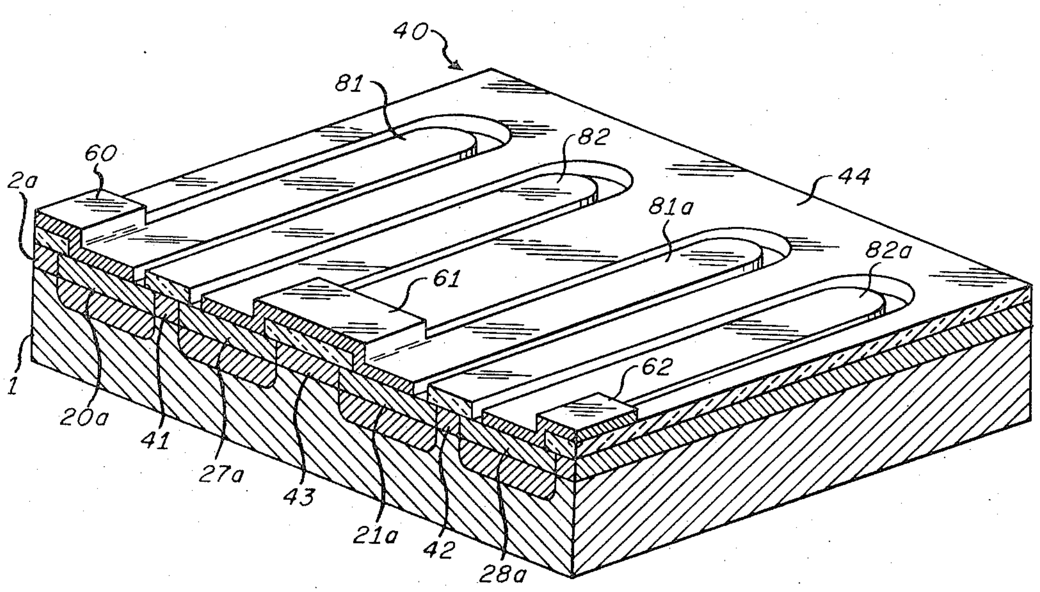
Figure 8:
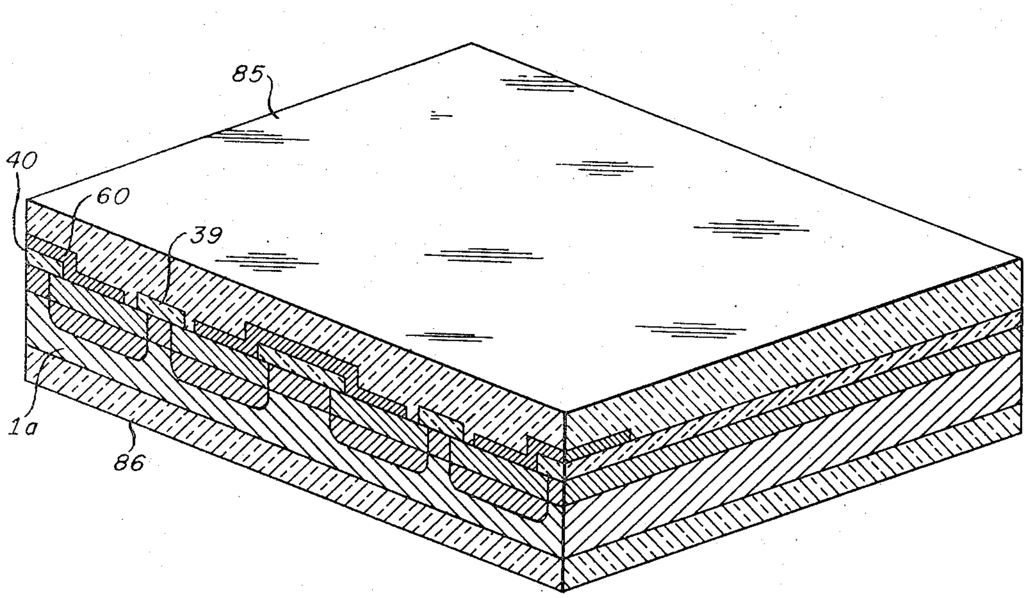

Referring to FIGS. 7 and 9, conductors such as conductors 60, 61, and 62 of FIG. 7 are now to be applied on top of the beryllium oxide layer 40. Over-layers electrodes 81, 82, 81*a*, 82*a*, are to be formed on elements 20*a*, 27*a*, 21*a*, 28*a*, respectively. The set including conductors 60, 61, and 62 is only an example of the total conductor connections thus to be provided. As seen in FIG. 9, additional conductors are associated with the series sub-array 8 of surface diodes. For example, conductor 60 is connected to electrode 11, conductor 61 connects electrodes 31 and 12, conductor 62 connects electrodes 32 and 13, conductor 63 connects electrodes 33 and 14, and electrode 34 is connected to conductor 64. All such elements are to be formed simultaneously on top of layer 40, along with corresponding conductor elements in the series diode sub-arrays 9 and 10. Furthermore, conductive circuit arms 70, 70*a* and 71, 71*a* are formed to connect the conductor 60 to the corresponding upper end conductors of sub-arrays 9 and 10 and also to connect end conductor 64 to the corresponding lower end conductors of the sub-arrays.

Photoresist material is spread over the surface of beryllium oxide layer 40 in the conventional manner. Actinic radiation is shown through a previously prepared mask of the type needed for forming conductor paths such as conductors 60 to 64 and 70, 70*a*, 71, and 71*b*. At the same time, conducting over-layers 81, 82, 81*a*, 82*a*, and the like are respectively formed on layers 20*a*, 27*a*, 21*a*, 28*a*, and the like. Undeveloped photoresist is removed to expose surfaces of layer 40 where conductors are to be formed, for example, by a conventional chemical or electro-deposition step. Other surfaces of the wafer not to be covered by conducting material may be masked in any suitable manner. After deposition, the photoresist and other masking materials are removed, and the resultant product, having the appearance of FIG. 7, is cleaned and dried.

Referring particularly to the diode sub-array series 8 in FIGS. 7 and 9, it is seen that conductors 70, 60 to 64 and 71, and cooperating conductor over-layers, such as over-layers 81, 82, 81*a*, 82*a* of FIG. 7, which may be of electroplate copper, silver, or gold, form a good electrical conducting path with respect to all of the lineal or elongate diode junction gaps, such as junctions 41, 42, and thereby assist in the efficient operation of the array, permitting all parts of the elongate gaps to be biased at substantially the same proper bias level. Thus substantially the entire length of each diode junction 41, 42 is efficiently used in interchange of energy between the diode bias voltage and oscillating high frequency fields which may be present in the vicinity of the diode array. The beryllium oxide layer 40 is so arranged as to be in intimate contact with each diode junction, such as at junctions 41, 42, for the purpose of rapidly removing thermal energy from the junction regions which would otherwise build up the junction temperature, leading to degraded operation thereof.

To complete the array structure, a final beryllium oxide film 85, for example, 10 microns thick and firmly bonded by direct deposition on the silicon material of surface 39 is developed, such film 85 being fully adequate as a protective passivating layer and also adequate for removal of moderate levels of thermal energy. Thicker films are readily achieved with increased cathode size and time of sputtering. For similar purposes, a sputtered layer 86 of beryllium oxide is placed on the free surface of layer 1. Before layer 86 is made, layer 1 is cut down in thickness to form layer 1*a* of FIG. 8. This is accomplished by a conventional etching process with beryllium oxide layer 85 masked with wax, and etching progresses until layer 1*a* is about 0.5 microns thick. The wafer is then removed from the etchant and cleaned and dried.

For removing relatively high levels of thermal energy, a thicker slab of beryllium oxide with the same width and length dimensions as the final array, may be procured on the market and bonded to the sputtered beryllium oxide layer 85. Another such slab may be similarly bonded to beryllium oxide layer 86.

Layers 85 and 86 perform two functions, acting as heat conductors to any available thermal sink, and as protective passivating layers for the semiconductor device. Both benefits accrue because sputtered beryllium oxide is found to bond intimately to the semiconductor surface.

Diode arrays of the geometrical type discussed in the preceding paragraphs have particular application in high efficiency oscillator and amplifier devices and in more conventional microwave circuit oscillators or amplifiers. For example, they have application in high efficiency mode avalanche semiconductor diode oscillators employing a transmission line network to match a diode or diode array to the oscillator load at a given output frequency, while harmonics as far up in frequency as the avalanche frequency are supported within the network, but are isolated from the actual output of the network. Transmission line circuits having such characteristics are taught in the M.I. Grace Pat. application S.N. 23,130 entitled "Semiconductor Diode High Frequency Signal Generator," filed Mar. 27, 1970 and in the M.I. Grace Pat. application S.N. 17,1970 entitled: "Semiconductor Diode High Frequency Signal Generator," filed Mar. 9, 1970 both of which are assigned to the present assignee. In such multiply resonant circuits, operation of high efficiency mode diodes is characterized by the use of diode bias current only in the presence of high frequency oscillating fields coupled to the diode element.

In the operation of high-efficiency-mode diodes in such apparatus, the diode or diodes are normally biased close to break down level. The high frequency or microwave signal, when super-imposed upon the unidirectional bias voltage, produces large changes in instantaneous diode voltage and current, which changes are such that a large negative resistance is generated at the same frequency as that of the signal applied across each diode. A current wave is generated containing many harmonic components which are also coupled across the diodes to produce amplified harmonic signals, thereby improving the conversion efficiency of the diode system. In general, the diode array may operate in a transmission line system whose characteristics satisfy the criteria of high efficiency mode operation for IMPATT or other transit time diodes.

The geometry of the described surface diode array lends itself in significant ways to such application in a microwave circuit for instance, of the ridged wave guide. In particular, the integrated circuit technique, especially when employed to generate planar structures, permits reliable construction of a large number of surface diodes in an array which may be efficiently coupled to a microwave field and which is properly interconnected for diode biasing. With respect to both the bias circuit and the microwave circuit, redundant or inferior surface diodes may readily be short circuited and their presence thus ignored.

A surface diode array which can be properly coupled to the oscillating microwave field must also demonstrate adequate heat dissipation. It can be seen that the elongate surface diodes used in the array have relatively low thermal impedance and have surface conducting electrode elements which can be placed at right angles to the microwave electric vector. Temperature rise is greatest at the center of the elongate diode junctions, since the center of the junction has heat sources on both sides and the beryllium oxide paths aid removal of such energy, more completely insuring a uniform junction temperature. Such is desirable, as the break down voltage of a diode junction is a sensitive function of temperature, though such sensitivity in silicon is relatively low. A desirably low thermal time constant is also readily achieved.

Figure 10:
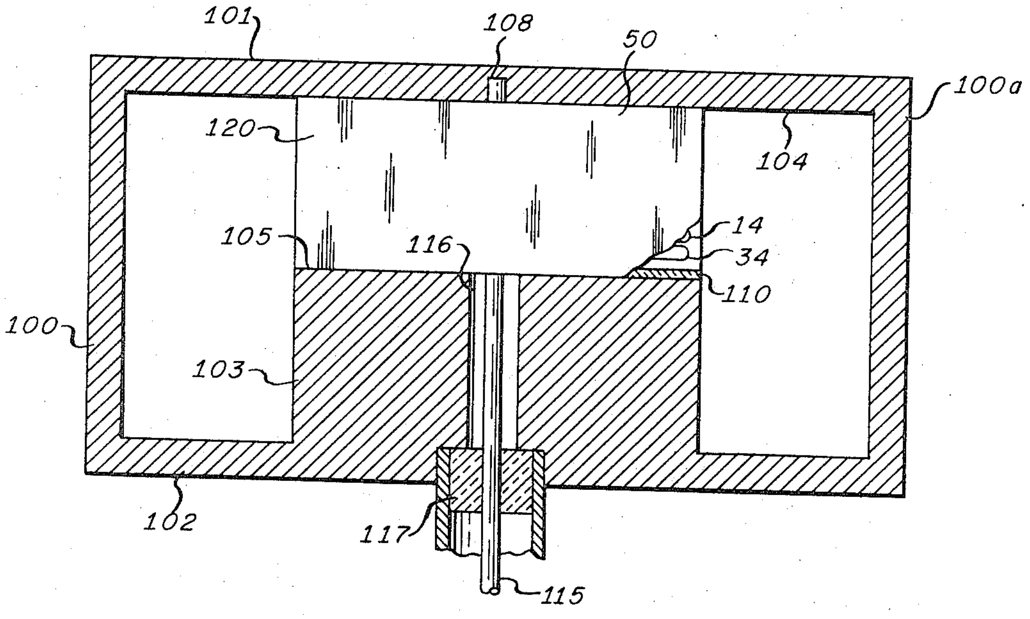
FIG. 10 is an elevation view, partly in cross section, showing a form of the invention used in a transmission line device.

FIGS. 9 and 10 illustrate how the inventive surface diode array is coupled, for example, to the oscillating high frequency field in a ridged wave guide oscillator of the type, for example, disclosed in the above mentioned Grace Pat. application S.N. 23,130, now U.S. Pat. No. 3,646,357. The hollow wave guide transmission line, as seen in FIG. 10, is provided with narrow side walls 100 and **100*a*, a top wall 101, and a bottom wall 102 in integral rectangular configuration. Bottom wall 102 has a reentrant extension or ridge 103 extending centrally into the interior of the transmission line ridge 103 having a flat surface generally parallel to the interior flat surface 104 of wall 101. Interior surfaces of the walls and ridge are composed of materials highly conducting to high frequency currents. The array 120 has dimensions which permit it to fit closely within the region above ridge 103. The upper electrically conducting surface 50 of array 120 fits in electrical and thermal conductive relation against interior surface 104. A pin 108 or other locating means may be used positively to locate array 120 with reference to surface 104**.

Array 120 is provided on its edge opposite edge 50 with an insulating layer 110 preferably constructed of beryllium Oxide so that it is electrically insulated from ridge 103. However, layer 110 provides a low impedance heat path between array 120 and the thermally conductive metal ridge 103. Electrically connected to the circuit arms 71, **71*a* of the array is a conductive rod 115 which passes through the bore 116 in ridge 103, through insulating support bead 117, and out of the confines of the wave guide. It has the purpose of providing one connection from a source of unidirectional bias voltage (not shown) to the circuit arms 71, 71*a* and thus to the diode sub-arrays 8, 9, and 10. The other side of the bias source may be coupled, for example, to the upper wall 101 of the guide and thence to the circuit arms 70, 70*a***.

An oscillating microwave electric field in the TE mode concentrated mainly in the gap region between surfaces 104 and 105 is everywhere substantially at right angles to the surface diode junctions of each subarray. Each surface diode, with its associated conductive electrode plates, finds concentrated across it a substantially equal portion of the effective total oscillating electric field which would be present in the ridged guide in the absence of the array. This division of the oscillating field results in part because of the interconnections 60 to 64, each of which are substantially perpendicular to the oscillating electric field, and because of the series connection of the surface diode elements in each sub-array.

A second benefit also comes about because of the selected configuration of the array. With bias voltage applied to terminals 108 and 115 and thus substantially equally distributed to the sub-arrays 8, 9, and 10 by the respective circuit arms 70, **70*a*, 71, 71*a***, a substantially equal bias voltage is found across each surface diode of the total array. Furthermore the bias voltage across locations along a particular elongate surface diode is substantially constant. Thus, the selected configuration reliably provides a predictable level of oscillating electric field relative to bias level across each surface diode junction.

While the surface diodes themselves present a capacitive effect to microwaves in the guide, such a relation in reasonable degree is desirable for efficient energy interchange with the microwave field. Further, the total capacitive effect is readily controlled in the design of the series-parallel combination used in the array and is in part controlled by making the depth of the diode into the substrate very shallow, on the order of the skin depth within the semiconductor junction. While the vertical conductors 61 to 63, for example, may demonstrate inductive effects, such may also be controlled according to their selected dimensions so that undesired resonance effects are not presented. A generally distinctive feature of the individual diodes in that diode length is many times the width of the diode junction. The maxiumum length of the diodes themselves is selected to be less than that which would permit them to break into resonance after the manner of strip transmission lines; i.e., the surface diode junction length must be less than $\lambda/2$, where $\lambda$ is the wave length in the semiconductor material of the junction. Thus, each surface diode is excited cophasally in the simple electric field mode characteristic of conventional ridged wave guide. While the surface diode array has some of the characteristics of an ordinary single diode packaged in the ordinary manner in that impedance matching or transforming elements may be used because of its effective impedance versus frequency characteristic, this matter is corrected in the conventional manner by conventional impedance matching elements. The mis-match imposed by the inventive diode array need not be excessive, however, considering that a practical array may be made with only about five per cent of the wafer surface looking like a conductor to microwave energy present in the ridge wave guide. Reflection of energy by the microcircuit array is therefore of the degree which may be modified or corrected by conventional impedance matching techniques.

It is seen that the novel semiconductor diode apparatus and its method of manufacture supply a novel surface diode semiconductor microcircuit for efficient operation at high power levels upon high frequency signals. The arrangement of the surface diodes of the microcircuit array is such as to permit efficient interaction with high frequency oscillating fields, while cooperating effectively with means for supplying bias potentials and for efficiently dealing with heat lost in each of the diodes of the array. The invention is seen to be applicable to the manufacture of diode arrays for various kinds of high frequency oscillator or amplifier structures, and to the manufacture of semiconductor arrays having diodes operating according to various operational modes.

While the invention has been described in its preferred embodiment, it is to be understood that the words which have been used are words of description rather than limitation and that changes within the purview of the appended claims may be made without departure from the true scope and spirit of the invention in its broader aspects.

I claim:

1. A semiconductor body having planar surface means and comprising:

a first plurality of thin elongate space discrete regions of a first conductivity type at said surface means, a second plurality of thin elongate discrete regions of a second conductivity type at said surface means, said regions of said first plurality being spaced in non-overlapping interleaved proximity with respect to said regions of said second plurality forming at said planar surface a plurality of spaced discrete elongated semiconductor diode junctions, heat conducting, electrically insulating means bonded in passivating relation to said plurality of elongate semiconductor diode junctions, and conductor means connecting said plurality of elongate semiconductor diode junctions in series circuit relation at said planar surface means for the purpose of supplying substantially equal bias voltage across each said semiconductor diode junction.

2. Apparatus as described in claim 1 wherein said first and second thin elongate discrete regions respectively comprise diode cathode and diode anode elements.

3. Apparatus as described in claim 2 wherein at least one of said diodes has its cathode conductively coupled to the anode of a first adjacent diode and its anode conductively coupled to the cathode of a second adjacent diode.

4. Apparatus as described in claim 1 wherein said semiconductor diode junctions extend below said semiconducting surface means substantially the skin depth for the operating wave length.

* * * * *